US006326683B1

(12) United States Patent
Houdeau et al.

(10) Patent No.: US 6,326,683 B1
(45) Date of Patent: Dec. 4, 2001

(54) CARRIER ELEMENT FOR A SEMICONDUCTOR CHIP

(75) Inventors: Detlef Houdeau, Langquaid; Michael Huber, Nittendorf; Volker Rohde, Forstinning; Richard Scheuenpflug, Sinzing; Peter Stampka, Schwandorf-Klardorf, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/193,577

(22) Filed: Nov. 17, 1998

Related U.S. Application Data (63) Continuation of application No. PCT/DE97/00977, filed on May 14, 1997.

(30) Foreign Application Priority Data

May 17, 1996 (DE) ............................................. 196 20 025
Sep. 3, 1996 (DE) ............................................. 196 35 732

(51) Int. Cl.[7] .............................. H01L 21/44; H01L 23/02
(52) U.S. Cl. .......................... 257/679; 257/739; 257/692; 257/668; 257/774; 257/778; 257/698; 438/118; 438/119
(58) Field of Search ................................. 257/679, 739, 257/692, 668, 774, 778, 698; 438/118, 119

(56) References Cited

U.S. PATENT DOCUMENTS

| | | | |
|---|---|---|---|
| 4,549,247 | * 10/1985 | Hoppe et al. | 361/398 |
| 4,864,383 | * 9/1989 | Gloton et al. | 357/68 |
| 4,908,937 | * 3/1990 | Gloton et al. | 29/840 |
| 5,162,894 | * 11/1992 | Asano et al. | 257/691 |
| 5,285,057 | * 2/1994 | Murohara | 235/492 |
| 5,289,034 | * 2/1994 | Hundt | 257/678 |
| 5,294,829 | * 3/1994 | Hundt | 257/678 |
| 5,334,803 | * 8/1994 | Yamamura et al. | 174/52.4 |
| 5,399,903 | * 3/1995 | Rostoker et al. | 257/666 |
| 5,550,402 | * 8/1996 | Nicklaus | 257/669 |
| 5,550,406 | * 8/1996 | McCormick | 257/666 |
| 5,925,445 | * 7/1999 | Suzuki | 428/209 |
| 6,037,665 | * 3/2000 | Miyazaki | 257/773 |

FOREIGN PATENT DOCUMENTS

| | | |
|---|---|---|
| 654 143 A5 | 1/1986 | (CH) . |
| 30 46 192 A1 | 7/1982 | (DE) . |
| 3809005 * | 9/1989 | (DE) . |
| 38 09 005 A1 | 9/1989 | (DE) . |
| 39 01 402 A1 | 7/1990 | (DE) . |
| 34 24 241 C2 | 5/1992 | (DE) . |
| 42 02 265 A1 | 9/1992 | (DE) . |
| 42 32 625 A1 | 3/1994 | (DE) . |
| 0 103 888 A2 | 3/1984 | (EP) . |
| 0 311 435 A2 | 4/1989 | (EP) . |
| 2617668 * | 6/1989 | (FR) . |
| 2684236 * | 5/1993 | (FR) . |

* cited by examiner

Primary Examiner—Roy Potter
(74) Attorney, Agent, or Firm—Herbert L. Lerner; Laurence A. Greenberg; Werner H. Stemer (57) ABSTRACT

A carrier element for a semiconductor chip which can be incorporated in smart cards and soldered onto circuit boards using SMD technology. For this purpose, a copper lamination of a plastic sheet is structured by etching in such a way that contact areas are formed in one piece with conductor tracks which end at the edge of the carrier element and enable reliable soldering.

13 Claims, 5 Drawing Sheets

FIG 5

CARRIER ELEMENT FOR A SEMICONDUCTOR CHIP

CROSS-REFERENCE TO RELATED APPLICATION

This application is a continuation of copending International Application No. PCT/DE97/00977, filed on May 14, 1997, which designated the United States.

BACKGROUND OF THE INVENTION

FIELD OF THE INVENTION

The invention relates to a carrier element for a semiconductor chip, in particular for incorporation in smart cards. The carrier element has a metallic sheet laminated onto a non-conductive sheet and is structured so that two parallel rows of contact areas are formed which run along opposite main edges of the carrier elements. The semiconductor chip is disposed on that side of the non-conductive sheet that is opposite to the metallic sheet, and is electrically connected to contact areas through cutouts in the non-conductive sheet.

Such carrier elements are disclosed, for example, in German Patent DE 34 24 241 C2 and are employed to a great extent in smart cards. To produce them, a non-conductive sheet, which is nowadays preferably composed of glass-fiber-reinforced epoxy resin, is laminated with a conductive sheet preferably composed of surface-refined copper. Structures are etched into the conductive sheet, which structures form mutually insulated contact areas which are disposed in two mutually parallel rows on the long sides of a central area. It is usual for one of the outer contact areas to be formed in one piece with the central contact area. Before the lamination operation, holes are stamped into the non-conductive sheet. The holes enable access to the contact areas in order to be able to connect a semiconductor chip electrically to the contact areas, with the result that contact can be made with the the semiconductor chip by a reading device via the contact areas. It is also possible to provide a central stamping for the accommodation of the semiconductor chip, as is the case describe in German Patent DE 34 24 214 C2, for example, in order to reduce the total height of the carrier element-chip configuration.

Carrier elements of the above-described type are known from French Patent Nos. FR-A-2617668 and FR-A-2684236. With the carrier elements described there, the contact areas are connected with conductor tracks that lead to a joint terminal, in order to perform in a simple manner a galvanic surface processing (refinement).

Nowadays, the known carrier elements usually have an approximately rectangular base area with the two rows of contact areas running along two opposite edges of the carrier element.

In the past, semiconductor chips for smart cards fulfilled almost exclusively specific storage functions and, on account of their serial data input, were suitable only for use in smart cards. However, with the increasing dissemination of smart cards having microprocessor functions, the semiconductor chips used therefor have become more generally usable, since microprocessors having a serial input, in particular those with special coprocessors, are used even when they are not packaged in a smart card. For example, they can also be incorporated in PCMCIA cards or generally be employed on circuit boards.

The technology that is preferred nowadays for connecting a semiconductor chip and a circuit board is soldering in accordance with SMD technology (Surface Mounted Device). In this case, a solder paste is applied to the circuit board by screen printing and the semiconductor chips, which are housed as SMDs, are then positioned on this. The circuit board is subsequently transferred to a furnace in order to melt the solder and thereby establish a connection between the circuit board and the semiconductor chip.

Chip housings with an SMD capability have specially shaped terminals that permit automatic mounting and a likewise automatic soldering operation. The soldered connection must be reliable and be produced at defined points without the solder flowing away and, as a result, short circuits arising or good contact not being produced.

In contrast to this, today's carrier elements for smart cards have relatively large-area contacts, which primarily serve to establish reliable contact with scanning tips of a reading device. The ISO standard ISO 7816, in particular, stipulates the necessary minimum size and position of the contact areas.

It is therefore necessary to provide different housings or chip carriers for different applications, which leads to an increase in the production costs on account of different manufacturing processes, logistics, materials, etc.

Swiss Patent CH 654 143 A5 discloses providing a carrier element for smart cards for other mounting methods as well, for example for incorporation in hybrid circuits. However, in the carrier element of that document, the contact areas for the smart card mounting and terminals which are formed in one piece with the contact areas lie in different planes, thereby necessitating complicated production. Moreover, the terminals are provided for making direct contact with the semiconductor chip, with the result that they cannot also be used as soldering lugs since this would damage the chip.

European Patent Application EP 0 311 435 A2 also describes a carrier element for smart cards which is made of a metal-laminated non-conductive substrate in which the metal lamination is structured into contact areas. In this case, conductor tracks forming terminals are formed in one piece with the contact areas. However, the terminals serve for making direct contact with a semiconductor chip disposed in a cutout in the substrate and, for this purpose, project into the region of the cutout. The terminals cannot, therefore, be used as soldering lugs in this case either.

SUMMARY OF THE INVENTION

It is accordingly an object of the invention to provide a carrier element for a semiconductor chip which overcomes the above-mentioned disadvantages of the prior art devices of this general type, which both complies with the ISO standards applicable to smart cards and also has SMD mounting capability.

With the foregoing and other objects in view there is provided, in accordance with the invention, in combination with a semiconductor chip, a carrier element for mounting the semiconductor chip, including: a non-conductive sheet having opposite main edges, a first side and a second side opposite the first side, the non-conductive sheet having a plurality of holes formed therein; a metallic sheet laminated onto the first side of the non-conductive sheet and has two parallel rows of contact areas running along the opposite main edges of the non-conductive sheet, the metallic sheet has conductor tracks with given widths and terminals running in one plane with the metallic sheet, the terminals have dimensions and spacings between one another corresponding to ISO-standards for surface mounting device soldering, each of the contact areas is integrated in one-piece with a respective conductor track and the contact areas have widths greater than the given widths of the conductor tracks; and the semiconductor chip is disposed on the second side of the non-conductive sheet opposite the metallic sheet, the semiconductor chip is electrically connected to the contact areas through the plurality of holes in the non-conductive sheet.

During the production of a copper-laminated glass epoxide carrier element, in the manner according to the invention, not only contact areas but also narrow conductor tracks connected in one piece thereto are etched. The copper sheet should in this case have a thickness of at least 35 µm, preferably about 70 µm, in order to ensure a sufficiently large spacing between the circuit board and the non-conductive plastic sheet, thereby reducing the risk of an electrical short circuit due to the solder paste. The non-conductive sheet is preferably made of Kapton, which has sufficient temperature stability for SMD soldering. The narrow conductor tracks, which preferably have a width of about 0.4 mm and thus comply with the SMD standard, enable clearly defined soldering. The conductor tracks advantageously run parallel to one another and at the same time preferably have a spacing between their center lines of about 1.27 mm, which likewise complies with the SMD standard. In this case, the conductor tracks can run both parallel to the rows of the contact areas and perpendicular thereto. In principle, however, any desired direction is possible.

In accordance with an added feature of the invention, the non-conductive sheet has a recess formed therein and the semiconductor chip is disposed in the recess. The metallic sheet extends over the entire extent of the recess and may also extend over the entire extent of the non-conductive sheet.

In an advantageous development of the invention, the conductor tracks end at the edge of the carrier element, with the result that visual monitoring of the soldered connection is possible. In a further refinement, the conductor tracks have a constriction as a flow barrier, with the result that the soldering can take place only in a specific region and, at the same time a good connection is ensured.

In a further development of the invention, the conductor tracks are divided into two groups that end at opposite edges of the carrier element.

In another development of the invention, the non-conductive sheet has edges running perpendicular to the main opposite edges, and the conductor tracks end at the edges of the non-conductive sheet running perpendicular to the opposite main edges.

When the conductor tracks end at the edge of the carrier element, it may lead to the situation where no more copper sheet is present in the center of the carrier element. When electrical contact is made between the semiconductor chip disposed on the other side of the non-conductive substrate and the contact areas by wire bonding technology, it may happen that the substrate sheet is buckled, which can lead to poor bonding results. In an advantageous development of the invention, therefore, areas of the copper sheet are left in the central region of the carrier element, which areas are connected to the conductor tracks and/or contact areas in order not to produce any parasitic capacitances. These areas act as supporting elements in order to prevent buckling of the non-conductive sheet during wire bonding.

In a further refinement according to the invention, it is provided that the insulating sheet has at least one cutout, which leaves the terminals that are provided for permanent contact-making (such as soldering) uncovered. Consequently, it is possible to see the terminals from the side of the insulating sheet, so that, after soldering of the terminals, the soldering result can be visually monitored. Without this cutout according to the invention, such visual monitoring would not be possible, since the electrically conductive sheet and slots and/or recesses possibly present therein would be covered in their entirety by the non-conductive or insulating sheet.

A development of the invention provides for at least one of the terminals to be bent away from the insulating sheet. This has the advantage that, during soldering, a capillary effect of the solder in the case of terminals which have only a small spacing from one another is avoided, which effect can occur between terminals which are not angled or bent away.

Another development of the invention provides for at least one of the terminals to be fastened to the insulating sheet on two sides of the cutout, which are favorably disposed opposite one another. In this case, the fastening of the terminal can be severed at one of the two sides of the cutout, with the result that this terminal, too, can subsequently be bent away from the insulating sheet. The two-sided fixing of the terminals prevents them from being unintentionally bent or damaged owing to handling or transportation of the carrier element. On the other hand, the advantageous bending-away of the terminal prior to soldering is nevertheless possible by severing one side of the connection to the non-conducting sheet.

Although the invention is illustrated and described herein as embodied in a carrier element for a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
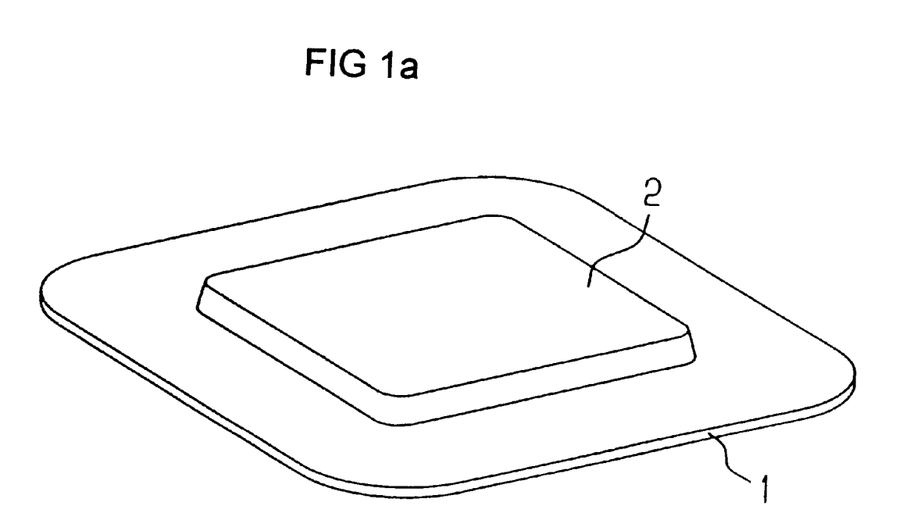
FIG. 1a is a top perspective view of a carrier element according to the invention.

In all the figures of the drawing, sub-features and integral parts that correspond to one another bear the same reference symbol in each case. Referring now to the figures of the drawing in detail and first, particularly, to FIGS. 1a and 1b thereof, there is shown a carrier element according to the invention in a perspective illustration of the top side and of the bottom side. FIG. 1a illustrates the top side, which shows a non-conductive substrate 1 made of a plastic which is as temperature-resistant as possible, such as Kapton, for example. Disposed on the substrate 1 is a plastic housing 2, in the interior of which there is a semiconductor chip 18 (see FIG. 6). The plastic housing 2 can be applied by injection molding or by casting. In the latter case, it is possible to provide a supportive frame on the substrate 1.

Figure 1B:
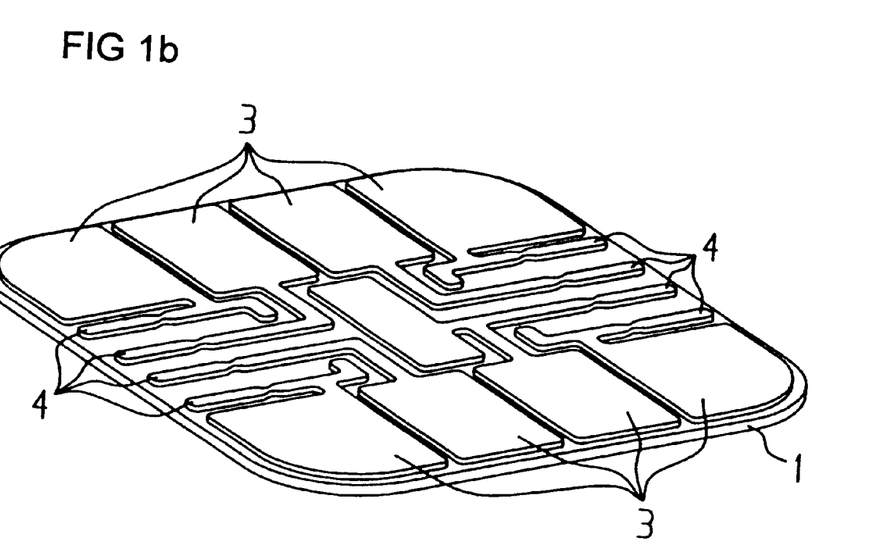
FIG. 1b is a bottom perspective view of the carrier element according to the invention.

FIG. 1b illustrates the underside of the carrier element and shows the contact areas 3 as well as the conductor tracks 4 connected thereto and formed in one piece.

Figure 2:
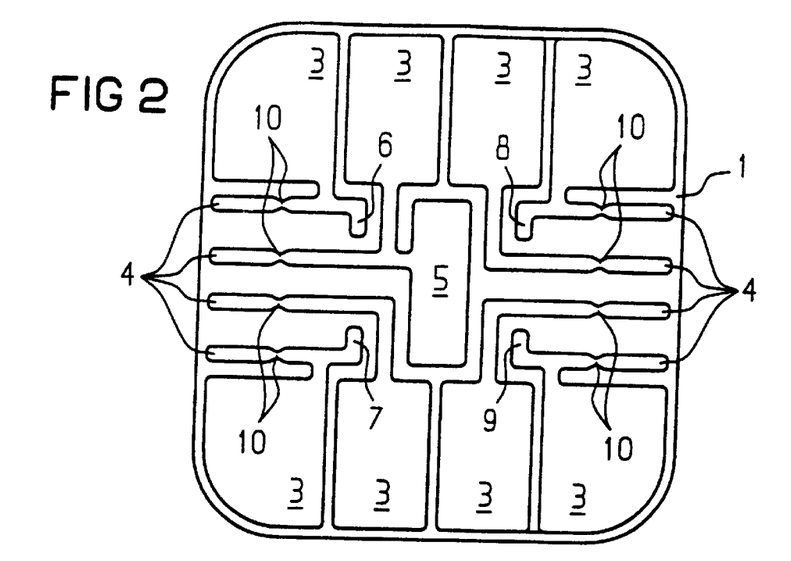
FIG. 2 is a bottom plan view of the carrier element according to FIG. 1.

FIG. 2 shows the underside (bottom) in plan view. The contact areas 3 run in two parallel rows along two opposite edges of the carrier element. The areas in this case cover the regions with which contact is to be made by a reading device and whose size and position are defined by the ISO standard ISO 7816.

Conductor tracks 4, which are subdivided into two groups, run between the two rows of contact areas 3 and parallel thereto, each of the conductor tracks 4 are connected in each case to one of the contact areas 3. In this case, the two groups end at opposite edges of the carrier element, with the result that a spacing of about 1.27 mm can be left between the center lines of the conductor tracks 4 in order to comply with the standard for SMD soldering. In this case, the conductor tracks 4 have, at least at their ends where the soldering takes place, a width of about 0.4 mm.

In the case of the carrier element shown in FIG. 2, the conductor tracks 4 have a constant width. As a result, in the center of the carrier element and in the regions where the corners of a semiconductor chip disposed on the opposite side of the carrier element come to lie, regions would be produced where the copper sheet is etched away. As a result, the problem arises that the non-conductive substrate 1 can buckle during the wire bonding of the chip, in other words when the latter is being electrically connected to the contact areas. For this reason, in an advantageous development of the invention, copper regions 5, 6, 7, 8, 9 have been left which are connected in one piece to some of the conductor tracks 4 in order to avoid parasitic capacitances. In principle, the conductor tracks 4 could alternatively be configured to be wider at their ends that are connected to the contact areas 3.

Near their free ends, the conductor tracks 4 have constrictions 10, which act as flow barriers for the solder. This enables even more accurate soldering to be carried out.

In the embodiment according to FIG. 2, the conductor tracks 4 are routed to the edge of the carrier element. However, they could equally end in the center of the carrier element. However, visual monitoring of the soldering would no longer be possible.

Figure 3:
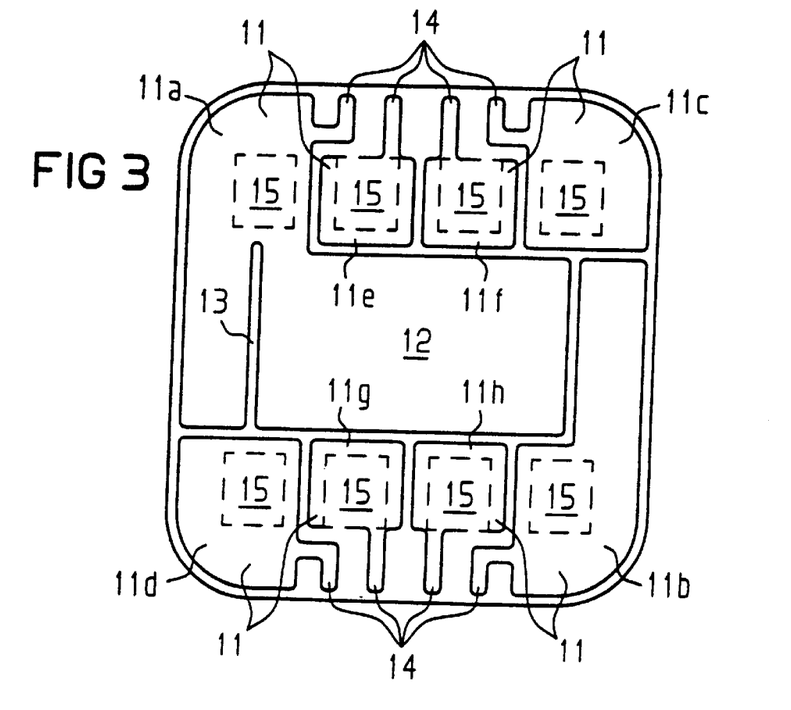
FIG. 3 is a bottom plan view of a further variant of the carrier element.

FIG. 3 shows a further embodiment of a carrier element according to the invention. In this case, contact areas 11 likewise run in two parallel rows, but along a central area 12 which is formed in one piece with one of the corner contact areas 11a. The composite formed by the central area 12 and the corner contact area 11a has a slot 13, which is about as long as the width of the central area 12. It runs parallel to the edge of the carrier element at a distance that corresponds approximately to the width of an adhesive film by which the carrier element is bonded into a plastic card. A hot melt bonding method is used for this purpose, that is to say a hot punch presses the carrier element onto the card for a certain time, until the adhesive film has melted. The slot 13 prevents the heat of the punch from passing via the copper sheet to the semiconductor chip, which is applied in the region of the central area 12, and from possibly damaging the chip.

For the same reason, the central area 12 does not extend to the opposite edge of the carrier element either. Instead, one of the corner contact areas 11b at that point is extended along the edge of the carrier element at that point.

In this exemplary embodiment, conductor tracks 14 according to the invention, which are used for SMD soldering, run perpendicular to the direction of the contact area rows and are situated between the corner contact areas 11a, . . . 11d. For this reason, the central contact areas 11e, . . . 11h do not extend as far as the edge of the carrier element but only as far as the line predetermined by the ISO standard ISO 7816 and indicated by dashes.

The minimum size and position of the contact area 11 is illustrated by dashed regions 15.

The conductor tracks 14 are in this case significantly shorter than in the exemplary embodiment according to FIG. 2, but nevertheless permit reliable soldering. In this case, too, it is possible to provide constrictions as a flow barrier. However, this is not illustrated in FIG. 3. In the exemplary embodiment according to FIG. 3, too, the width and spacing of the conductor tracks 14 comply with the SMD soldering standard.

Figure 4:
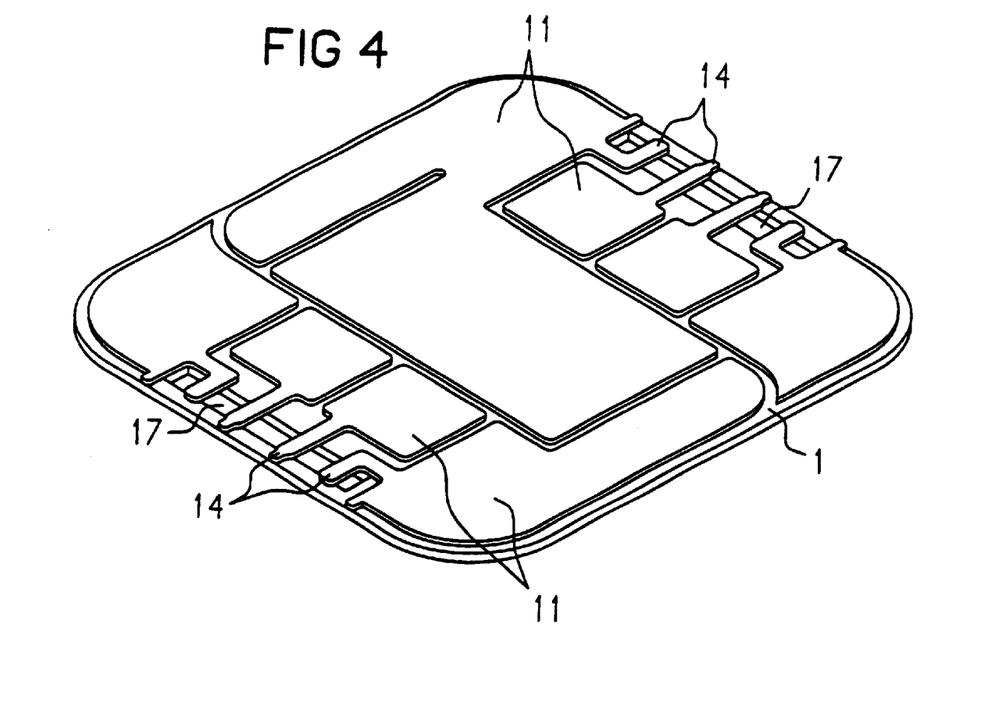
FIG. 4 is a bottom perspective view of the carrier element from a side of an electrically conductive sheet.

FIG. 4 shows a development of the carrier element according to the invention that has already been illustrated in FIG. 3. In this case, too, the contact areas 11 are provided for releasable contact-making of the carrier element and the conductor tracks or terminals 14 are provided for permanent contact-making of the carrier element. Releasable contact-making via the contact areas 11 is present when the carrier element is inserted into a smart card which, for contact-making, can then be pushed into corresponding reading devices and subsequently be withdrawn from the latter. Permanent contact-making is when the carrier element is instead soldered onto a circuit board, for example.

In this exemplary embodiment, the carrier element has two cutouts 17 in the insulating sheet 1 which leave the terminals 14 which are provided for permanent contact-making uncovered by the insulating sheet 1. Since the cutouts 17 are situated at a distance from the outer edge of the insulating sheet 1, it is possible, as shown in FIG. 4, for the terminals 14 to project beyond the cutouts 17 and, consequently, to be fastened by bonding to the insulating sheet 1 on two opposite sides of the cutouts 17. This two-sided fixing of the terminals 14 has the advantage that they are protected from damage despite their filigree dimensions. Overall, this increases the robustness of the carrier elements.

Figure 5:
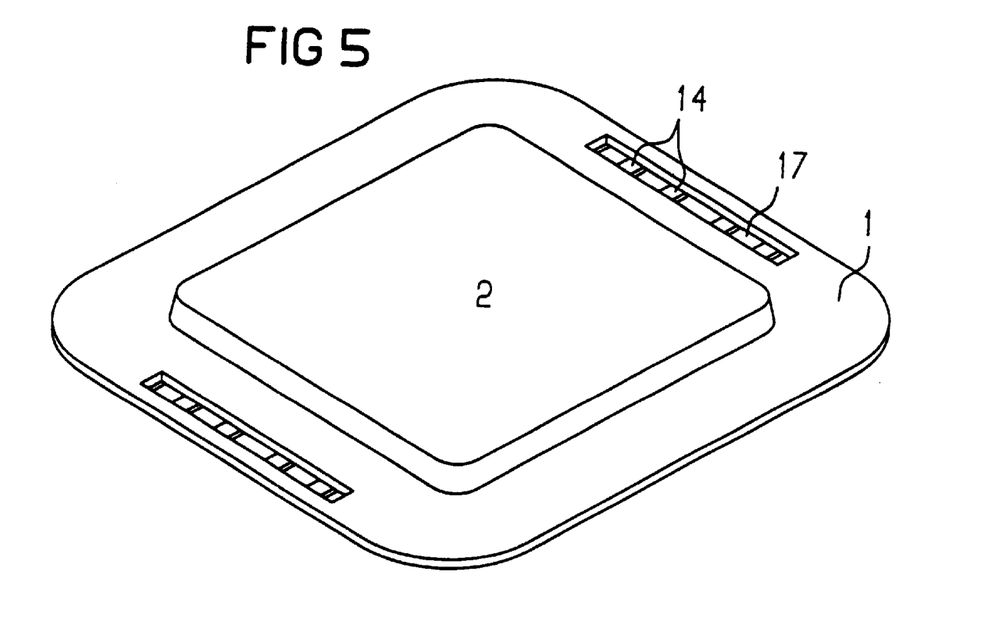
FIG. 5 is a top perspective view of the carrier element of FIG. 4 on which an electrically insulating sheet is situated.

FIG. 5 shows the carrier element of FIG. 4 from the other side (top view). In FIG. 5, the carrier element has already been provided with the semiconductor chip surrounded by the housing 2. In this case, the housing 2, which is usually produced from a thermosetting plastic, is visible and not the chip itself, which is disposed inside the housing 2. The electrical connections between the terminals of the chip and the contact areas 11 and the terminals 14 are also concealed by the chip housing 2.

The carrier element can be produced in the following manner:

a. Epoxy resin, polyester sheet or Kapton, for example, is suitable for the production of the electrically insulating sheet 1. It has a thickness of between 60 and 180 $\mu$m. Holes are produced by stamping in the insulating sheet 1, by which holes the electrical connection between the chip and the contact areas and the terminal can be effected later. The cutouts 17 according to the invention can also be produced by the same stamping operation.

b. Production of an electrically conductive sheet 3–10, 11, 12, 14, favorably made of copper, which has a thickness of 35 to 70 µm.

c. It is now possible to produce the contact areas and the terminals in the conductive sheet, either by stamping, whereupon the two sheets are laminated together, or, prior to the structuring of the conductive sheet, the two sheets are laminated together, whereupon the structuring of the conductive sheet is carried out by photoresist coating and subsequent exposure and etching.

d. Coating of the conductive sheet with nickel (for the production of a diffusion barrier, an improvement in the bonding capability and an enhancement of the tribological properties) and with gold (in order to prevent corrosion and for optical reasons).

Figure 6:
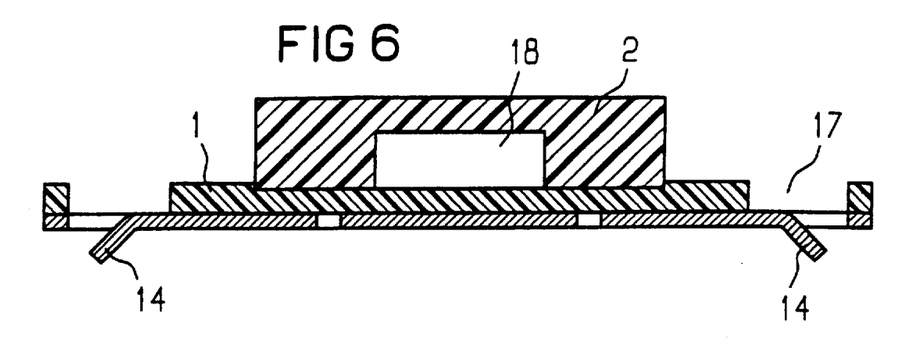
FIG. 6 is a cross-sectional view of the carrier element of FIG. 4, with a chip having an encapsulation and terminals bent away from the insulating sheet.
Figure 7:
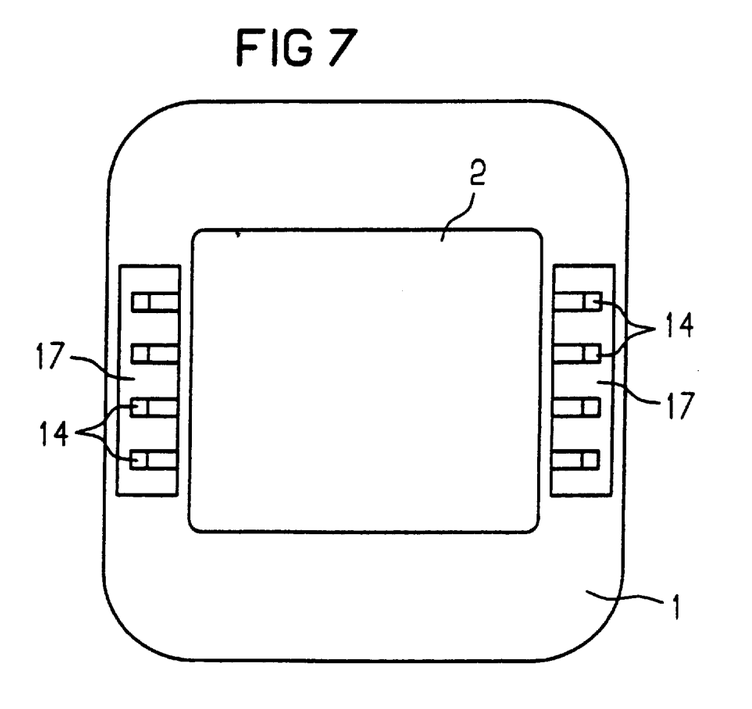
FIG. 7 is a top plan view of the carrier element of FIG. 6.

FIG. 6 shows the carrier element of FIGS. 4 and 5 in a cross-sectional view, and FIG. 7 shows it in a top plan view, the illustrations not being to scale. In the case of the carrier element in FIG. 6, the terminals 14 have been separated, for example by stamping, from their fastening to the insulating sheet 1 in each case on one side of the cutouts 17. The terminals 14 have subsequently been angled or bent away downwards from the insulating sheet 1. The electrical connection between the terminals 14 and the semiconductor chip 18 is, of course, preserved via the second fastening of the terminals 14.

The angling-away of the terminals 14 has the advantage of avoiding a capillary effect for the solder on account of the relatively small spacing between adjacent terminals 14. What is critical for this is the vertical spacing, achieved by the inventive bending-away of the terminals 14, between the solder surface and the underside of the insulating sheet 1.

From the figures, in particular FIG. 6, it is clearly discernible that, by virtue of the cutouts 17 according to the invention in the insulating sheet 1, during soldering of the terminals 14 for the purpose of establishing permanent contact-making of the carrier element, on the one hand direct access exists from above the insulating sheet 1 to the soldering point and, on the other hand, after the conclusion of the soldering operation, the result thereof can be visually monitored. This is particularly advantageous since great unevenness of the electrically conductive sheet can occur during the production of carrier elements on account of the mechanical stress as a result of a high degree of shrinkage of the material of the housing 2. This can lead to short circuits between the contact areas 11 or the terminals 14 or to further soldering faults, such as insufficient wetting, shrink holes, etc.

In contrast to the illustration in FIG. 6, it is, of course, also possible not to bend the terminals 14 away from the insulating sheet 1 as a result of which stamping-out of the terminals 14 on one side of the cutout 17 becomes unnecessary. Although the advantage of avoiding a capillary effect for the solder is dispensed with, manufacturing steps are saved while simultaneously retaining the advantage of visual monitorability of the permanent contact-making and reliable fixing of the terminals 14 to the insulating sheet 1.

In other exemplary embodiments of the invention, it is also possible for the cutouts 17 to be disposed directly at the edge of the insulating sheet 1. In this case, or if the terminals 14 in the exemplary embodiments represented are not fastened to the outer sides of the cutouts 17 (in that they are either not bonded there or do not even project beyond the cutout 17), it is possible in a particularly simple manner to bend the terminals 14 away from the insulating sheet 1, since no stamping operation is required for this purpose.

It goes without saying that embodiments of the invention are also possible in which the number of cutouts 17 differs from that in the carrier elements represented. As a modification to the subjects represented, each of the cutouts 17 can, for example, be subdivided again between the individual terminals 14. The shape and configuration of the cutouts 17 must be adapted depending on the configuration of the terminals 14.

The invention is particularly suitable for permanent contact-making of the carrier element via the terminals using SMD technology. However, it is also possible to insert the bent-away terminals in a conventional manner into holes situated in a circuit board and solder them there. In that case, too, the cutouts according to the invention enable visual monitoring of the soldering result.

For the production of the permanent contact-making of the terminals 14, bonding by a conductive adhesive is another option that can be considered in addition to soldering.

As a result of the inventive construction of the contact side of a metal-laminated plastic-substrate carrier element with conductor tracks formed in one piece with the contact areas, the carrier elements can both be incorporated in smart cards and soldered onto circuit boards.

We claim:

1. In combination with a semiconductor chip, a carrier element for mounting the semiconductor chip, comprising:
   a non-conductive sheet having opposite main edges, a first side and a second side opposite said first side, said non-conductive sheet having a plurality of holes formed therein;
   two parallel rows of metallic contact areas laminated to said first side of said non-conductive sheet and running along said opposite main edges of said non-conductive sheet;
   metallic conductor tracks with given widths and metallic terminals, said terminals having dimensions and spacings between one another corresponding to ISO-standards for surface mounting device soldering, each of said contact areas forming one-piece with a respective conductor track and said contact areas having widths greater than said given widths of said conductor tracks; and
   the semiconductor chip disposed on said second side of said non-conductive sheet opposite said contact areas, the semiconductor chip electrically connected to said contact areas through said plurality of holes in said non-conductive sheet.

2. The carrier element according to claim 1, wherein said non-conductive sheet has a recess formed therein and the semiconductor chip is disposed in said recess.

3. The carrier element according to claim 1, wherein said conductor tracks extend to an edge of said non-conductive sheet.

4. The carrier element according to claim 1, wherein said conductor tracks each have a constriction.

5. The carrier element according to claim 1, wherein said conductor tracks are divided into two groups of said conductor tracks, said conductor tracks of a respective group ending at opposite edges of said non-conductive sheet.

6. The carrier element according to 1, wherein said conductor tracks end at said opposite main edges of said non-conductive sheet.

7. The carrier element according to claim 1, wherein said non-conductive sheet has edges running perpendicular to said main opposite edges, and said conductor tracks ending at said edges of said non-conductive sheet running perpendicular to said opposite main edges.

8. The carrier element according to claim 1, comprising a metallic central region laminated to said first side of said non-conductive sheet, at least one of said conductor tracks forming one-piece with said central region.

9. The carrier element according to claim 8, wherein said integrally formed portion has a given width greater than said widths of said conductor tracks.

10. The carrier element according to claim 1, wherein said non-conductive sheet has at least one cutout formed therein, said terminals extending over said cutout exposing parts of said terminals necessary for forming a contact.

11. The carrier element according to claim 10, wherein at least one of said terminals is bent away from said non-conducting sheet.

12. The carrier element according to claim 10, wherein at least one of said terminals is fastened to said non-conductive sheet on two sides of said cutout.

13. In combination with a semiconductor chip, a carrier element for incorporation into smart cards and mounting the semiconductor chip, comprising:

a non-conductive sheet having opposite main edges, a first side and a second side opposite said first side, said non-conductive sheet having a plurality of holes formed therein;

two parallel rows of metallic contact areas laminated to said first side of said non-conductive sheet and running along said opposite main edges of said non-conductive sheet;

metallic conductor tracks with given widths and metallic terminals, said terminals having dimensions and spacings between one another corresponding to ISO-standards for surface mounting device soldering, each of said contact areas forming one-piece with a respective conductor track and said contact areas having widths greater than said given widths of said conductor tracks; and the semiconductor chip disposed on said second side of said non-conductive sheet opposite said contact areas, the semiconductor chip electrically connected to said contact areas through said plurality of holes in said non-conductive sheet.

* * * * *

UNITED STATES PATENT AND TRADEMARK OFFICE
CERTIFICATE OF CORRECTION

PATENT NO. : 6,326,683 B1
DATED : December 4, 2001
INVENTOR(S) : Detlef Houdeau et al.

It is certified that error appears in the above-identified patent and that said Letters Patent is hereby corrected as shown below:

<u>Title page,</u>
Item [56], should read as follows:

| | U.S. PATENT DOCUMENTS | | |
|---|---|---|---|
| 4,549,247 | * 10/1985 | Hoppe et al. | 361/398 |
| 4,864,383 | * 9/1989 | Gloton et al. | 29/840 |
| 4,908,937 | * 3/1990 | Gloton et al. | 257/691 |
| 5,162,894 | * 11/1992 | Asano et al. | 235/492 |
| 5,285,057 | * 2/1994 | Murohara | 257/678 |
| 5,289,034 | * 2/1994 | Hundt | 257/678 |
| 5,294,829 | * 3/1994 | Hundt | 257/678 |
| 5,334,803 | * 8/1994 | Yamamura et al. | 174/52.4 |
| 5,399,903 | * 3/1995 | Rostoker et al. | 257/666 |
| 5,550,402 | * 8/1996 | Nicklaus | 257/699 |
| 5,550,406 | * 8/1996 | McCormick | 257/666 |
| 5,925,445 | * 7/1999 | Suzuki | 428/209 |
| 6,037,665 | * 3/2000 | Miyazaki | 257/773 |

UNITED STATES PATENT AND TRADEMARK OFFICE
CERTIFICATE OF CORRECTION

PATENT NO. : 6,326,683 B1
DATED : December 4, 2001
INVENTOR(S) : Detlef Houdeau et al.

It is certified that error appears in the above-identified patent and that said Letters Patent is hereby corrected as shown below:

```
        FORGEIGN PATENT DOCUMENTS
654 143 A5             1/1986 (CH)
30 46 192 A1           7/1982 (DE)
3809005         *      9/1989 (DE)
38 09 005 A1           9/1989 (DE)
39 01 402 A1           7/1990 (DE)
34 24 241 C2           5/1992 (DE)
42 02 265 A1           9/1992 (DE)
42 32 625 A1           3/1994 (DE)
0 103 888 A2           3/1984 (EP)
0 226 480 A1           6/1987 (EP)
0 321 327 A1           6/1989 (EP)
0 311 435 A2           4/1989 (EP)
0 599 194 A1           6/1994 (EP)
2617668         *      1/1989 (FR)
2684236         *      5/1993 (FR) --
```

Signed and Sealed this

Twenty-second Day of June, 2004

JON W. DUDAS
*Acting Director of the United States Patent and Trademark Office*